United States Patent
Keller

(10) Patent No.: US 11,260,628 B2
(45) Date of Patent: Mar. 1, 2022

(54) FABRICATION PROCESS FOR LAMINATED GLASS COMPRISING A FUNCTIONAL FILM

(71) Applicant: KURARAY EUROPE GMBH, Hattersheim (DE)

(72) Inventor: Uwe Keller, Avon (FR)

(73) Assignee: KURARAY EUROPE GMBH, Hattersheim (DE)

(*) Notice: Subject to any disclaimer, the term of this patent is extended or adjusted under 35 U.S.C. 154(b) by 225 days.

(21) Appl. No.: 16/347,892

(22) PCT Filed: Nov. 6, 2017

(86) PCT No.: PCT/EP2017/078257
§ 371 (c)(1),
(2) Date: May 7, 2019

(87) PCT Pub. No.: WO2018/083280
PCT Pub. Date: May 11, 2018

(65) Prior Publication Data
US 2019/0283366 A1 Sep. 19, 2019

(30) Foreign Application Priority Data
Nov. 7, 2016 (DE) .......................... 102016221752.6

(51) Int. Cl.
*B32B 17/10* (2006.01)
*H01L 31/048* (2014.01)

(52) U.S. Cl.
CPC .... *B32B 17/10036* (2013.01); *B32B 17/1022* (2013.01); *B32B 17/1066* (2013.01);
(Continued)

(58) Field of Classification Search
None
See application file for complete search history.

(56) References Cited

U.S. PATENT DOCUMENTS 7,312,275 B2 12/2007 Papenfuhs et al.
7,358,304 B2 4/2008 Papenfuhs et al.
(Continued)

FOREIGN PATENT DOCUMENTS

EP 1 527 107 B1 5/2005
EP 1 606 325 B1 12/2005
(Continued)

OTHER PUBLICATIONS

International Search Report PCT/EP2017/078257, dated Mar. 23, 2018.

*Primary Examiner* — Ramsey Zacharia
(74) *Attorney, Agent, or Firm* — Brooks Kushman P.C.

(57) ABSTRACT

Laminated glass contains two glass sheets interlayered with at least one polymer film C which is provided with a coating A comprising a polyvinyl acetal PA and optionally at least one plasticiser WA, and at least one film B containing a polyvinyl acetal PB and at least one plasticiser WB wherein coating A comprises less than 16% by weight of plasticiser, film B comprises at least 16% by weight of plasticiser, and film C comprises polyamide, polyethylene terephthalate, polybutylene terephthalate, polyvinyl alcohol, polylactic acid, polyethylen furanoate cellulose acetate, polymethyl methacrylates, polyethylene naphthalate, ionomers, or combinations thereof, wherein film C is located between coating A and film B.

16 Claims, 1 Drawing Sheet

(52) U.S. Cl.
CPC .. *B32B 17/10174* (2013.01); *B32B 17/10568* (2013.01); *B32B 17/10633* (2013.01); *B32B 17/10688* (2013.01); *B32B 17/10761* (2013.01); *B32B 2307/202* (2013.01); *B32B 2307/304* (2013.01); *B32B 2457/12* (2013.01); *H01L 31/0488* (2013.01)

(56) References Cited

U.S. PATENT DOCUMENTS

| | | | |
|---|---|---|---|
| 7,511,096 | B2 | 3/2009 | Papenfuhs et al. |
| 7,528,192 | B2 | 5/2009 | Papenfuhs et al. |
| 2009/0181203 | A1* | 7/2009 | Valentin ............. G02F 1/157 428/38 |
| 2011/0076473 | A1 | 3/2011 | Lin et al. |
| 2012/0067404 | A1 | 3/2012 | Keller |
| 2013/0115435 | A1* | 5/2013 | Hagen ............. B32B 17/10036 428/213 |
| 2013/0224456 | A1* | 8/2013 | Moran ............. B32B 17/10174 428/214 |
| 2015/0217540 | A1 | 8/2015 | Keller |
| 2016/0263866 | A1 | 9/2016 | Keller |

FOREIGN PATENT DOCUMENTS

| | | |
|---|---|---|
| EP | 3246157 A1 | 11/2017 |
| JP | 2001163640 A | 6/2001 |
| WO | 03/020776 A1 | 3/2003 |
| WO | 2004/063231 A1 | 7/2004 |
| WO | 2005059013 A1 | 6/2005 |

\* cited by examiner

FABRICATION PROCESS FOR LAMINATED GLASS COMPRISING A FUNCTIONAL FILM

CROSS REFERENCE TO RELATED APPLICATIONS

This application is the U.S. National Phase of PCT Appln. No. PCT/EP2017/078257 filed Nov. 6, 2017, which claims priority to German Application No. 10 2016 221 752.6 filed Nov. 7, 2016, the disclosures of which are incorporated in their entirety by reference herein.

BACKGROUND OF THE INVENTION

1. Field of the Invention

The invention pertains to interlayer laminating films containing a polymer film.

2. Description of the Related Art

It is known to provide laminated glass with additional features like heat shielding or improved penetration resistance by embedding a thin, optional functionalised polymer film in the laminate. For this purpose, thin PET films are widely used since they have high modulus of elasticity and good heat resistance and can be easily functionalised for example by sputtering with heat-shielding materials.

In order to produce laminated glass sheets with heat-shielding properties, thin PET films coated in an IR-absorbing or IR-reflecting manner are embedded between a plurality of layers of plasticiser-containing polyvinyl acetal. This system has the disadvantage that at least 3 film layers (1× functionalised PET, 2×PVB film) always have to be used, since PET cannot be directly molten on a glass surface.

As an alternative to this, WO 2005/059013 A1 proposes the application of heat-absorbing nanoparticles by printing PVB film with special printing inks. However, the adhesion properties of the film to the glass surface can be adversely affected by the printing.

Due to the fact that PVB films must have a roughened surface in order to remove the air in a lamination process without difficulty, it is likely that a thin PET film applied thereto will be optically uneven following pressing with a glass surface. In addition, the printing of thick plasticised film webs is difficult, since such films are elongated as they are unwound and may then shrink back again.

The problem addressed by the present invention was therefore to provide intermediate layer films comprising an optionally functionalised polymer film without sacrificing the necessary safety and thickness properties of laminated glazing as required for automobile or architectural windows.

SUMMARY OF THE INVENTION

It has been found that polymer films, for example those produced from PET can be advantageously coated with thin layers based on polyvinyl acetal having low amounts or no plasticiser and that these films can be directly molten on one of the glass surfaces with the typical production methods for laminated glass laminates. The usual required safety properties of laminated glass laminates can then be obtained in combination with at least one layer formed of plasticiser-containing polyvinyl acetal.

DETAILED DESCRIPTION OF THE PREFERRED EMBODIMENTS

Figure 1:
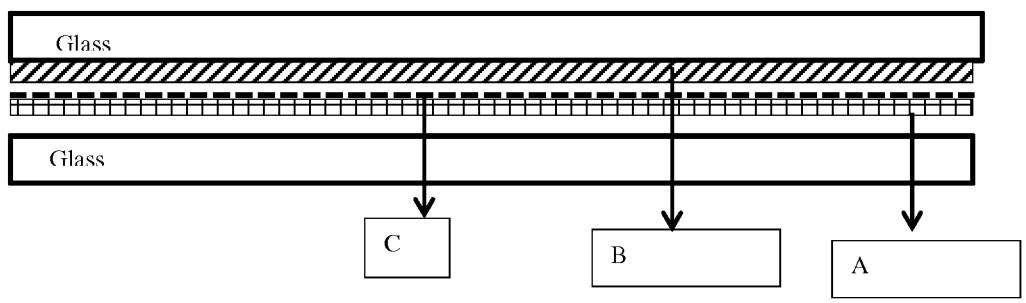
FIG. 1 is a cross sectional view of laminated glass according to one embodiment of the invention.
Figure 2:
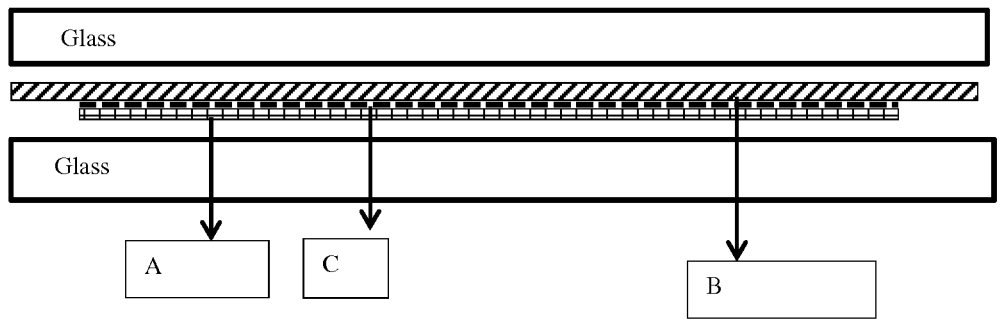
FIG. 2 is a cross sectional view of laminated glass according to another embodiment of the invention.

The invention therefore relates to a Laminated glass consisting of two glass sheets interlayered with at least one polymer film C provided with a coating A comprising a polyvinyl acetal PA and optionally at least one plasticiser WA, and at least one film B containing a polyvinyl acetal PB and at least one plasticiser WB, wherein Coating A comprises less than 16% by weight of plasticiser WA, film B comprises at least 16% by weight of plasticiser WB, film C comprises polyamide, polyethylene terephthalate (PET), polybutylene terephthalate (PBT), polyvinyl alcohol (PVA), polylactic acid (PLA), polyethylene furanoate (PEF) cellulose acetate, polymethyl methacrylate (PMMA), polyethylene naphthalate (PEN), ionomers, or combinations thereof, and wherein film C is located between coating A and film B.

Film C preferably has a thickness in a range between 10-1000 µm, more preferably 20-500 µm, yet more preferably 30 µm-200 µm and most preferably 40 µm-150 µm. The thickness of coating A is 10-150 µm, preferably 20-120 µm.

In a preferred embodiment of the invention, the tensile stress of film C @10% elongation is at least 100% that of film B, preferably 150% of film B, and most preferably 200% of the tensile stress of film B @10% elongation when measured according to DIN EN ISO 527-1/527-3 (23° C./30% RH). This embodiment provides laminated glass with enhanced penetration resistance.

In another embodiment, films C are provided with a heat-shielding function. The term "heat-shielding function" refers to films which have a reduced total solar transmittance (TTS) measured as follows:

TTS (film C as a base film)–TTS (film C with heat-shielding properties) >10%, >12.5%, >15%, >17.5% or >20%

Total solar transmittance (TTS) is measured according to ISO 13837:2008 (v=14 m/s; value in %) in a test laminate consisting of 2×2.1 mm clear glass (for example Planilux™) and a standard automotive film as film B (for example TROSIFOL VG R10 0.76) in combination with a film C and coating A, each as film without heat-shielding function as compared to a laminate wherein film C has the heat-shielding function.

In addition, film C with heat-shielding function may be defined by a high ratio of light transmission (TL, measured in accordance with EN 410; 2011, value in %) to heat-shielding effectiveness. Heat-shielding films C used in accordance with the invention preferably have quotients of TL/TTS of more than 1.2 or of more than 1.25 or of more than 1.30 or of more than 1.35 or of more than 1.40 or of more than 1.45.

The heat-shielding function of films C may be provided by a metallic coating for example containing silver, gold, indium, aluminium or rhodium. The coating may have a thickness of 1-500 nm and can be applied for example by chemical vapour decomposition methods. A good commercial example of such heat-shielding film is EASTMAN'S XIR® SOLAR CONTROL FILMS which consist of PET substrate film carrying different kinds of metallic coatings which reflect heat radiation but keep a relatively high light transmission.

In a another embodiment film C may contain heat-shielding particles, for example ITO, ATO, AZO, IZO, zinc antimonates, tin-doped zinc oxide, silicon-doped zinc oxide, gallium-doped zinc oxide, tungstates, such as $LiWO_3$, $NaWO_3$, $CsWO_3$, lanthanum hexaboride or cerium hexaboride.

In still another embodiment film C may be composed of a plurality of alternating layers having a different refractive index in order to provide a (non-metallic) reflective heat shielding function. Such alternating layers may be formed themselves by coating thin layers containing inorganic particles such as $TiO_2$ and $SiO_2$ or by coextruding polymer melts from PET and PMMA or PET and PEN.

In further embodiments coating A and/or film B may contain the aforementioned heat shielding particles. The heat-shielding properties of coating A and/or B may be provided in addition or separately to heat-shielding function of film C.

The heat-shielding particles preferably have a mean diameter from 5 to 500 nm. The proportion of heat-shielding particles in or on the coating A and/or films B and/or C may be 1-20% by weight, preferably 2-10% by weight. The proportion of heat-shielding particles in or on the film 3 may be 0.05-2% by weight, preferably 0.2-1% by weight.

Coating A and/or film C may comprise electrically conductive structures, such as heating wires, antennas or other layers having optical functions or may be decoratively printed. If film C is metallized, such coating may as well be used as resistive heater.

In another embodiment, films C are provided with a photovoltaic function. Such photovoltaic function may be provided by coating or depositing photovoltaic material on the surface of film C, or by adhering a photovoltaic layer on film C. The coating or layer may comprise for example gallium arsenide, cadmium telluride, copper indium gallium diselenide, crystalline silicon and amorphous thin-film silicon. The coating may have a thickness of 10 to 500 nm, whereas adhered crystalline silicon may be utilized in a thickness of up to 200 µm. For this embodiment, films C may have all properties and features (either alone or in any combination thereof) in view of chemistry or composition as disclosed in this application.

The coating A and film B may contain, in the starting state prior to lamination of the layers and also in the intermediate layer stack located in the laminated glass laminate, a single plasticiser as well as mixtures of plasticisers both of different or of identical composition. The term "different composition" refers to both the type of plasticiser and proportion thereof in the mixture. In regions of the glass laminate in which film C is interposed between film B and coating A, no or only very slow migration of plasticiser between coating A and film B is possible. In regions of the glass laminate free of film C (e.g. a cut-out or back-cut area at the laminated edge) coating A and film B preferably have the same plasticisers WA and WB in the finished laminate.

Plasticiser-containing films B used in accordance with the invention contain at least 16% by weight, such as 16.1-36.0% by weight, preferably 22.0-32.0% by weight and in particular 26.0-30.0% by weight of plasticiser.

Film C is coated with coating A on one or both sides, but at least one coating A is located adjacent to film B. Coating A used in accordance with the invention may contain less than 16% by weight (such as 15.9% by weight), less than 12% by weight, less than 8% by weight, less than 6% by weight, less than 4% by weight, less than 3% by weight, less than 2% by weight, less than 1% by weight or even no plasticiser (0.0% by weight). Coating A with a low plasticiser content preferably contains 0.0-8% by weight plasticiser.

In the method according to the invention, coating A has a thickness of no more than 20%, preferably 15%, and preferably no more than 10% of the thickness of the film or films B.

The thickness of coating A is 10-150 µm, preferably 20-120 µm, more preferably 30-100 µm, yet more preferably 40-80 µm and most preferably 50-70 µm.

Film C may be provided with coating A by the usual methods known to a person skilled in the art, like raking, printing, casting, solvent coating, extrusion or calandering. It is preferred to apply the coating in a roll-to-roll process optionally directly following the production/decoration of film C Solvent coating includes gravure coating, and slot die coating, and spray coating. In such variants, constituents of coating A can be dissolved in a suitable solvent such for example methanol, ethanol, tetrahydrofuran (THF), methylene chloride or mixtures thereof.

Extrusion coating may be performed by casting the molten coating composition from a slot die onto film C and then cooling the coated film C.

The material of coating A is produced separately from film B and has either no plasticiser at all or a small proportion of plasticiser. For the case, that coating A is equipped with heat-shielding particles, the dispersion of the latter is not influenced adversely by such a low plasticizer content.

The thickness of film B is 450-2500 µm, preferably 600-1000 µm, more preferably 700-900 µm. With use of a plurality of films B, the same is true for the total thickness thereof. If films B are stretched prior to production of the sandwich and/or additionally are adapted to the shape of a screen (for example a windscreen) in a curved manner, the specified thicknesses at the moment of lamination may reduce once more by up to 20%.

While film C can be coated on both sides, at least one surface coated with A is oriented relative to an inner glass surface of the glass laminate whereas at least one film C is encapsulated between coating A and film B in the glass laminate according to the invention. It is also possible to apply a coating A to both glass surfaces, such that a laminated glass with a layer sequence like glass/coating A/film C/film B/film C/coating A/glass is provided. Here, the decoration of the coating A and film C may be the same or different.

In the case of automotive glazing, it is not preferable for aesthetic and stability reasons to seal the edges of the laminated glass laminates with sealants. This promotes the susceptibility of such glazing to the formation of edge defects, such as detachments of the layers from one another (delamination) or corrosion or chemical modification of an IR-absorbing layer reaching as far as the edge of the laminate.

In the method according to the invention, the film C with coating A can be tailor cut and positioned such that it does not reach everywhere in the laminated glass laminate as far as the edge of the laminate. In such an embodiment, both coating A and film C are smaller by at least 1 mm compared to film B and at least one glass sheet, such that the periphery of the laminate is exclusively sealed by film 3 which in this case makes contact with both inner glass surfaces in this edge region.

Furthermore, the thin film C with the coating A can be perforated prior to the insertion into the glass/film sandwich, such that it can have openings, such as passages, holes or slits, in any geometric patterns.

The film C with its coating A can thus have at least one opening, such that by means of this opening film B makes contact with both inner glass surfaces in this opening region. In particular, openings can thus be obtained at points of the laminated glass behind which the function of sensor elements, optics elements and/or antenna elements would otherwise be hindered by a e.g. metallic heat-shielding layer.

Film C may have a size and position in the laminate such that it does not reach everywhere in the laminated glass to all edges of the laminate. In particular, the film may be smaller than the glass sheets and/or film B and/or coating A.

In yet another embodiment, film C may have the same size as coating A and film B (i.e. 100%), or less than 99%, 95%, 90%, 80%, 60%, 50%, preferably less than 40%, 30%, 20%, 15% of the surface area of the final laminated glass or of coating A and film B in the laminate.

The coating A and film B used in accordance with the invention contain polyvinyl acetals, which are produced by acetalisation of polyvinyl alcohol or ethylene vinyl alcohol copolymer.

The films can contain polyvinyl acetals, each having a different polyvinyl alcohol content, degree of acetalisation, residual acetate content, ethylene proportion, molecular weight and/or different chain lengths of the aldehyde of the acetal groups.

In particular, the aldehydes or keto compounds used for the production of the polyvinyl acetals can be linear or branched (that is to say of the "n" or "iso" type) containing 2 to 10 carbon atoms, which leads to corresponding linear or branched acetal groups. The polyvinyl acetals are referred to accordingly as "polyvinyl (iso)acetals" or "polyvinyl (n)acetals".

The polyvinyl (n)acetal used in accordance with the invention results in particular from the reaction of at least one polyvinyl alcohol with one or more aliphatic unbranched keto-compounds containing 2 to 10 carbon atoms. To this end, n-butyraldehyde is preferably used.

The polyvinyl alcohols or ethylene vinyl alcohol copolymers used to produce the polyvinyl acetals in the coating A or film B may be identical or different, pure or a mixture of polyvinyl alcohols or ethylene vinyl alcohol copolymers with different degree of polymerisation or degree of hydrolysis.

The polyvinyl acetate content of the polyvinyl acetals in the coating A or film B can be set by use of a polyvinyl alcohol or ethylene vinyl alcohol copolymer saponified to an appropriate degree. The polarity of the polyvinyl acetal is influenced by the polyvinyl acetate content, whereby the plasticiser compatibility and the mechanical strength of the respective layer also change. It is also possible to carry out the acetalisation of the polyvinyl alcohols or ethylene vinyl alcohol copolymers with a mixture of a number of aldehydes or keto compounds.

The coating A or film B preferably contain polyvinyl acetals having a proportion of polyvinyl acetate groups based on the layers, either identically or differently, of 0.1 to 20 mol %, preferably 0.5 to 3 mol %, or 5 to 8 mol %.

The polyvinyl alcohol content of the used polyvinyl acetals PA or coating A having a lower plasticiser content in the starting state may be between 6-26% by weight, 8-24% by weight, 10-22% by weight, 12-21% by weight, 14-20% by weight, 16-19% by weight and preferably between 16 and 21% by weight or 10-16% by weight.

The polyvinyl alcohol content of the used polyvinyl acetals PB of film B, which is richer in plasticiser in the starting state, may be between 14-26% by weight, 16-24% by weight, 17-23% by weight and preferably between 18 and 21% by weight.

The coating A or film B preferably contain non-cross-linked polyvinyl acetal. The use of cross-linked polyvinyl acetals is also possible. Methods for cross-linking polyvinyl acetals are described, for example, in EP 1527107 B1 and WO 2004/063231 A1 (thermal self-cross-linking of polyvinyl acetals containing carboxyl groups), EP 1606325 A1 (polyvinyl acetals cross-linked with polyaldehydes) and WO 03/020776 A1 (polyvinyl acetal cross-linked with glyoxylic acid).

Coating A and/or film B used in accordance with the invention may contain, as plasticiser, one or more compounds selected from the following groups:

esters of polyvalent aliphatic or aromatic acids, for example dialkyl adipates, such as dihexyl adipate, dioctyl adipate, hexyl cyclohexyl adipate, mixtures of heptyl adipates and nonyl adipates, diisononyl adipate, heptyl nonyl adipate, and esters of adipic acid with cycloaliphatic ester alcohols or ester alcohols containing ether compounds, dialkyl sebacates, such as dibutyl sebacate, and also esters of sebacic acid with cycloaliphatic ester alcohols or ester alcohols containing ether compounds, esters of phthalic acid, such as butyl benzyl phthalate or bis-2-butoxyethyl phthalate.

esters or ethers of polyvalent aliphatic or aromatic alcohols or oligo ether glycols with one or more unbranched or branched aliphatic or aromatic substituents, for example esters of glycerol, diglycols, triglycols or tetraglycols with linear or branched aliphatic or cycloaliphatic carboxylic acids; Examples of the latter group include diethylene glycol-bis-(2-ethyl hexanoate), triethylene glycol-bis-(2-ethyl hexanoate), triethylene glycol-bis-(2-ethyl butanoate), tetraethylene glycol-bis-n-heptanoate, triethylene glycol-bis-n-heptanoate, triethylene glycol-bis-n-hexanoate, tetraethylene glycol dimethyl ether and/or dipropylene glycol benzoate phosphates with aliphatic or aromatic ester alcohols, such as tris(2-ethylhexyl)phosphate (TOF), triethyl phosphate, diphenyl-2-ethylhexyl phosphate, and/or tricresyl phosphate esters of citric acid, succinic acid and/or fumaric acid.

By definition, plasticisers are organic liquids having a high boiling point. For this reason, further types of organic liquids having a boiling point above 120° C. can also be used as plasticiser.

Coating A in the variants in which a plasticiser WA is present in coating A in the starting state, and also films B particularly preferably contain 1,2-cyclohexane dicarboxylic acid diisononyl ester (DINCH) or triethylene glycol-bis-2-ethyl hexanoate (3GO or 3G8) as plasticiser.

In addition, coating A and film B may contain further additives, such as residual quantities of water, UV absorber, antioxidants, adhesion regulators, optical brighteners or fluorescent additives, stabilisers, colorants, processing aids, organic nanoparticles, pyrogenic silicic acid and/or surface active substances. In particular, film B may comprise 0.001 to 0.1% by weight of alkaline salts and/or alkaline earth salts of carboxylic acids as adhesion regulators.

In order to avoid corrosion at the heat-shielding layers of film C, coating A preferably comprises less than 150 ppm chloride ions and/or nitrate ions and/or sulphate ions.

The chloride content of the coating A can thus be less than 150 ppm, preferably less than 100 ppm, and in particular less than 50 ppm. In the ideal case, the chloride content of the coating A is less than 10 ppm or even 0 ppm.

The nitrate content of coating A optionally may be less than 150 ppm, preferably less than 100 ppm, and in particular less than 50 ppm. In the ideal case, the nitrate content of coating A is less than 10 ppm or even 0 ppm.

Again optionally, the sulphate content of coating A may be less than 150 ppm, preferably less than 100 ppm, and in particular less than 50 ppm. In the ideal case, the sulphate content of the coating A is less than 10 ppm or even 0 ppm.

Coating A additionally may comprise more than 0 ppm magnesium ions. The magnesium content is preferably more than 5 ppm, more preferably 10 ppm, and in particular 5-20 ppm.

In order to avoid wrinkles in film C, film B should have low heat shrinkage. Preferably, film B is produced in a way that it shows at 60° C. within 1 h a heat shrinkage in the machine direction (extrusion direction) of less than 25%, more preferably less than 15%, or less than 10% and most preferably less than 5%. To the end of shrinkage measurement at the specified temperature, a 10×10 cm piece of film B having the extrusion direction marked, is put on a flat tray powdered with fine sand (to provide free movement without sticking to the surface) into an oven set to 60° C. and kept for one hour. The final length is compared to the initial length (10 cm).

In another embodiment, coating A has a higher glass temperature Tg (measured by DSC) than film B. Accordingly, glass temperature Tg (measured by DSC) of coating A is more than 5° C., more than 10° C. or more than 15° C. higher than the glass temperature Tg (measured by DSC) of film B.

Preferably, coating A has a glass temperature Tg (measured by DSC) higher than 25° C., or higher than 30° C., or higher than 40° C. and most preferably higher than 50° C.

The present invention also relates to a method for producing the described heat-shielding laminated glass laminates, in which the film C provided with coating A is positioned on a glass sheet, are then covered by at least one film B, and a second glass sheet is then applied. More particularly, film C can be provided with coating A and wound up and intermediately stored as a roll. This so provided film C/coating A may then be combined with two plies of glass and film B to obtain a laminate according to the invention. It is strongly preferred that when producing film C with coating A and film C carries a functional coating on one of its surfaces, coating A will be adhered onto such coated side of film C.

It is possible in accordance with the invention to first melt the film C with coating A onto a glass sheet over the entire area or locally by increased temperature and to then cover this with the film B. Alternatively, the film C with coating A and the film B can be positioned jointly between two glass sheets and moltend at increased temperature.

The lamination step for producing a laminated glass is preferably carried out such that film C with its coating A and film B are positioned between two glass sheets and the layered body thus prepared is pressed under increased or reduced pressure and increased temperature to form a laminate.

To laminate the layered body, the methods with which a person skilled in the art is familiar can be used with and without prior production of a pre-laminate.

What are known as autoclave processes are carried out at an increased pressure from approximately 10 to 15 bar and temperatures from 100 to 145° C. over approximately 2 hours. Vacuum bag or vacuum ring methods, for example according to EP 1 235 68 3 B1, function at approximately 200 mbar and 130 to 145° C.

What are known as vacuum laminators can also be used. These consist of a chamber that can be heated and evacuated, in which laminated glazing can be laminated within 30-60 minutes. Reduced pressures from 0.01 to 300 mbar and temperatures from 100 to 200° C., in particular 130-160° C., have proven their worth in practice.

In the simplest case, in order to produce the laminated glass laminates, coating A with film C or film B is firstly positioned on a glass sheet, and the further film B or film C and coating A is positioned synchronously or subsequently. The second glass sheet is then applied and a glass film laminate is produced. Excessive air can then be removed with the aid of any pre-lamination method known to a person skilled in the art. Here, the layers are also already firstly lightly adhesively bonded to one another and to the glass.

The glass film laminate may then be subjected to an autoclave process. A previously prepared film C with coating A is preferably positioned on the first glass sheet and covered by the thicker film B before the second glass sheet is applied. The method can be carried out in many conceivable and, in principle, practicable variants. For example, the film C with coating A can be removed from a roll of an appropriate width, whereas film B has been tailor-cut beforehand to the size of the laminated glass to be produced. This is advantageous in particular in the case of windscreens and other automotive glazing parts. In this case, it is particularly advantageous to additionally still stretch the thicker film B before it is tailor cut. This enables a more economical use of film, or, for the case in which film B has a colour tint, allows the adaptation of the curvature thereof to the upper sheet edge.

In the above described manners to prepare a laminated glass according to the invention, it is important to respect the relative order of coating A (contacting a glass surface and film C), film C (encapsulated between coating A and film C) and film B (contacting film C and a at least one glass surface).

In the automotive field, in particular for the production of windscreens, films that have what is known as an ink ribbon in the upper region are often used. To this end, film B can be co-extruded with a suitably coloured polymer melt, or there may be a different colouration in some areas in a multi-layer system of film B.

In accordance with the invention, films B may therefore have a colour tint, which in particular has already been adapted in a prior process step to the geometry of a windscreen.

It is also possible for the films B to have a wedge-shaped thickness profile. The laminated glass laminate according to the invention obtains a wedge-shaped thickness profile even with plane-parallel thickness profile of the coating A and can be used in motor vehicle windscreens for HUD displays.

In the simplest case, film B is a commercially available PVB film with or without ink ribbon and with or without a wedge-like thickness profile. Films B with nanoparticles dispersed therein for IR protection can also be used as coloured films. Of course, a film B may also be a film having an acoustic function, such that soundproofing properties are obtained in combination with film C and coating A. Of course, a film B may already also combine a number of the mentioned functions.

In addition, coating A may be surface modified with a regular, non-stochastic roughness by means of an embossing process between at least one cylinder pair. Such coating used in accordance with the invention preferably have a surface structure with a roughness Rz from 0 to 25 µm, preferably Rz from 1 to 20 µm, particularly preferably Rz from 3 to 15 µm and in particular Rz from 4 to 12 µm. It is particularly preferable that coating A has a surface roughness Rz of no more than 20% of its thickness.

EXAMPLES

A coating solution of Mowital® B60H (a commercial PVB grade produced by Kura ray Europe GmbH) with the following composition by weight was prepared by dissolving PVB and plasticizer in ethanol (Example 1)

15% B60H

1% plasticizer 3G8

84% ethanol

A further coating solution of Mowital® B60H with the following composition by weight was prepared by dissolving PVB, plasticizer and an ATO slurry in plasticizer in ethanol (Example 2)

15% B60H 0.5% plasticizer 3G8

0.5% ATO slurry a 3G8 (15% solid content)

84% ethanol

A 32 cm wide ribbon of SOUTHWALL XIR 75 (infrared reflective PET film containing silver layers) was guided through a lab coating machine and a coating solution described above was applied via a slot die onto its IR reflective functionalized side. The solvent was dried off by air convection at a temperature of 40° C. and ribbon speed and coating rate was set in a way to obtain the coating with a dry thickness of close to 30 µm and a plasticizer content of about 6% by weight.

30×30 cm sections of the PVB coated XIR 75 were combined with sheets of TROSIFOL® VG-SC+ 0.80 mm (a clear acoustic tri-layer of Kuraray Europe GmbH for automotive applications, containing 29% by weight of plasticizer) in a way that the coated face of the XIR 75 was oriented towards one of the inner glass surfaces, whereas the non-PVB-coated backside of the XIR 75 was oriented towards the VG-SC-+ sheet, that made the contact to a second glass. Planilux® 2.1 mm glass was used in the preassembly which were de-aired in a vacuum bag (10 min cold vacuum, 20 min vacuum at 90° C. air temperature) before subjecting them to a standard autoclave process (total of 90 min, 140° C. max, 12 bar max).

Resulting laminates were inspected for visual defects like bubbles or wrinkles (none), structural integrity by pummel test (no significant layer or glass separation) and optical properties given below (against a reference laminate produced with only VG-SC-+):

| | Ex 1 | Ex 2 | Comp 1 |
|---|---|---|---|
| Interlayer configuration | VG-SC+ with PVB coated XIR | VG-SC+ with PVB coated XIR (IR absorbing ATO particles incorporated in the PVB coating) | VG-SC+ |
| % Visible Light Transmission TL [EN410] | 79.1 | 72.9 | 89.9 |
| % Total Solar Transmittance TTS, v = 14 | 52.1 | 46.8 | 79.7 |
| Selectivity TL/TTS | 1.52 | 1.56 | 1.13 |

The invention claimed is:

1. Laminated glass, comprising two glass sheets laminated with an interlayer comprising:
   at least one polymer film C coated on at least one side with a solution-deposited coating A comprising a polyvinyl acetal PA and optionally at least one plasticiser WA, and
   at least one film B containing a polyvinyl acetal PB and at least one plasticiser WB, wherein coating A comprises less than 16% by weight of plasticiser WA, film B comprises at least 16% by weight of plasticiser WB, film C comprises polyamide, polyethylene terephthalate (PET), polybutylene terephthalate (PBT), polyvinyl alcohol (PVA), polylactic acid (PLA), polyethylene furanoate (PEF) cellulose acetate, polymethyl methacrylates (PMMA), polyethylene naphthalate (PEN), ionomers, or combinations thereof, wherein film C is located between coating A and film B, and wherein coating A has a thickness of not more than 150 µm.

2. The laminated glass of claim 1, wherein the tensile stress of film C @ 10% elongation is at least 100% that of the tensile stress film B @ 10% elongation.

3. The laminated glass of claim 1, wherein film C is provided with a heat-shielding function.

4. The laminated glass of claim 1, wherein film C is provided with a metallic heat-shielding coating.

5. The laminated glass of claim 1, wherein film C is provided with a non-metallic reflective heat-shielding function.

6. The laminated glass of claim 1, wherein film C comprises heat-shielding particles.

7. The laminated glass of claim 1, wherein coating A and/or film B comprises heat-shielding particles.

8. The laminated glass of claim 1, wherein the coating A comprises a polyvinyl acetal PA with a proportion of vinyl alcohol groups from 6 to 26% by weight and the film B comprises a polyvinyl acetal B with a proportion of vinyl alcohol groups from 14 to 26% by weight.

9. The laminated glass of claim 1, wherein the coating A has a thickness of 30-100 µm.

10. The laminated glass of claim 1, wherein film B comprises 0.001 to 0.1% by weight alkali metal and/or alkaline earth metal salts of carboxylic acids.

11. The laminated glass of claim 1, wherein the film C with coating A has a smaller surface area than film B.

12. The laminated glass of claim 1, wherein the film C with coating A has at least one opening, such that by means of this opening the film B is in direct contact with both inner glass surfaces of the laminate.

13. The laminated glass of claim 1, wherein the film B has a wedge-shaped thickness profile.

14. The laminated glass of claim 1, wherein the film B has a coloured region.

15. The laminated glass of claim 1, wherein coating A contains less than 150 ppm chloride ions and/or nitrate ions and/or sulphate ions.

16. The laminated glass of claim 1, wherein film C is provided with a photovoltaic function.

* * * * *